(12) United States Patent
Corvino et al.

(10) Patent No.: US 10,659,037 B2
(45) Date of Patent: May 19, 2020

(54) AUDIO SWITCHING CIRCUIT

(71) Applicant: MOTOROLA SOLUTIONS, INC., Chicago, IL (US)

(72) Inventors: David Corvino, Parkland, FL (US); Javier Alfaro, Miami, FL (US); Carlos A. Garrafa, Plantation, FL (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 0 days.

(21) Appl. No.: 16/117,862

(22) Filed: Aug. 30, 2018

(65) Prior Publication Data

US 2020/0076418 A1    Mar. 5, 2020

(51) Int. Cl.
*H03K 17/16*    (2006.01)
*H04R 3/00*    (2006.01)
*H03F 3/187*    (2006.01)

(52) U.S. Cl.
CPC ........... *H03K 17/165* (2013.01); *H03F 3/187* (2013.01); *H04R 3/00* (2013.01); *H03F 2200/03* (2013.01)

(58) Field of Classification Search
CPC ...... H03F 2200/03; H03G 3/34; H03G 3/348; H04R 25/603; H04R 2225/61; H04R 2420/01; H03K 17/6872; H03K 17/6874; H03K 17/6877
See application file for complete search history.

(56) References Cited

U.S. PATENT DOCUMENTS 9,253,564 B2 * 2/2016 Prentice .................. H04R 3/00
2016/0173980 A1 6/2016 Cecchin et al.

OTHER PUBLICATIONS

Achieve Bidirectional Control and Protection Through Back-to-Back Connected eFuse Devices, Texas Instruments, Application Report SLVA948—Dec. 2017.*

* cited by examiner

*Primary Examiner* — Kile O Blair
(74) *Attorney, Agent, or Firm* — Michael Best & Friedrich LLP

(57) ABSTRACT

Systems and methods for an audio switching circuit. One system includes an audio switching circuit including a first P-channel transistor including a first source terminal, a first gate terminal, and a first drain, a second P-channel transistor including a second source terminal, a second gate terminal, and a second drain terminal, and a control circuit. The second drain terminal is coupled to the first drain terminal. The first P-channel transistor is configured to receive a first audio signal at the first drain terminal. The control circuit is configured to disconnect the first gate terminal from a ground reference, and in response to the presence of the first audio signal, cause a first voltage between the first gate terminal and the first source terminal to be approximately zero and prevent the first audio signal from passing through the first drain terminal.

11 Claims, 3 Drawing Sheets

AUDIO SWITCHING CIRCUIT

BACKGROUND

Public safety personnel (for example, police, fire fighters, first responders, investigators, and the like) use electronic communication devices to communicate with one another during the performance of their duties. Such devices, for example, portable radios, may be configured to integrate with accessories that provide external audio. For example, a portable radio may be connected to a remote speaker microphone. The portable device sends audio signals to the accessory which, in some cases, amplifies the power level of the audio signals. It is highly desirable to reduce audio feedback in such portable communication devices.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
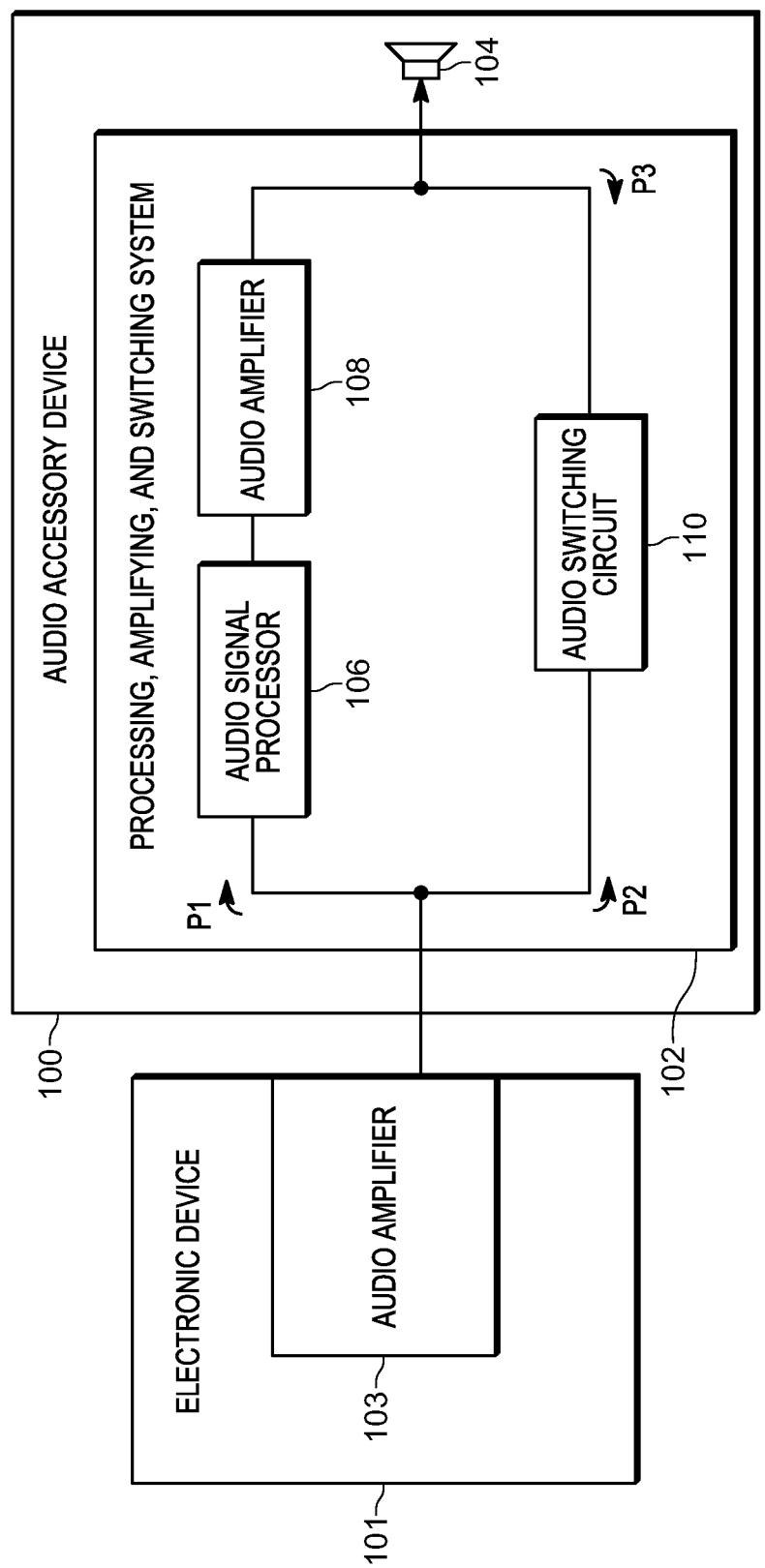
FIG. 1 is a block diagram of an electronic device and an audio accessory system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments.

The apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION

As noted, public safety personnel use electronic devices to communicate. Some electronic devices may be configured to be connected to an audio accessory device. For example, the audio accessory device may be configured to receive audio signals from the electronic device and output the audio signals through a speaker of the audio accessory device. In some instances, the audio accessory device is configured to amplify the power level of the audio signal before the audio signal is output through the speaker as audio sound. In many instances, audio accessory devices include a power source, for example, a battery. In circumstances where the battery is fully discharged, the audio accessory device may be configured to route the audio signal received from the electronic device directly to the speaker of the audio accessory device via an audio switch. In many instances, audio switches include one or more relays.

Unwanted feedback from the audio amplifier within the audio accessory device should be prevented from traversing back (feeding back) through the audio switch into the electronic device. While relays of a rating suitable to handle amplified audio signals may be implemented, relays are relatively expensive and large. Since they are relatively large, relays take up a significant amount of space on a printed circuit board. In addition, relays do not provide isolation to prevent feedback of large amplified audio signals into the electronic device.

Transistors are, in general, less expensive, and smaller than a relay. In accordance with some embodiments, there is provided herein an audio switching circuit utilizing transistors. The audio switching circuit is capable of passing and isolating amplified audio signals independent of the voltage specifications of the audio accessory device. Due to the limited ratings of transistors, a single stage transistor circuit may be unable to completely prevent amplified audio signals from feeding back through the audio switch circuit. Thus, among other things, there is provided herein a relatively inexpensive, small, multiple-stage circuit to attenuate feedback caused by unwanted higher amplitude audio signals, while still being able to pass through desired audio signals One example embodiment provides an audio switching circuit including a first P-channel transistor, a second P-channel transistor, and a control circuit. The first P-channel transistor includes a first source terminal, a first gate terminal, and a first drain terminal. The first P-channel transistor is configured to receive a first audio signal at the first source terminal. The second P-channel transistor includes a second source terminal, a second gate terminal, and a second drain terminal. The second drain terminal is coupled to the first drain terminal. The control circuit is coupled to the first gate terminal and the second gate terminal and is configured to disconnect the first gate terminal from a ground reference, and in response to the presence of the first audio signal, cause a first voltage between the first gate terminal and the first source terminal to be approximately zero and prevent the first audio signal from passing through the first drain terminal.

Another example embodiment provides a processing, amplifying, and switching system for an audio accessory device configured to receive an audio signal from an electronic device and output a processed and amplified audio signal. The system includes an audio speaker; an audio signal processor; and an audio amplifier connected to the audio signal processor and to the audio speaker and configured to amplify the audio signal. The system also includes an audio switching circuit coupled to the audio speaker. The audio switching circuit includes a first P-channel transistor including a first source terminal, a first gate terminal, and a first drain terminal. The first P-channel transistor is configured to receive a first audio signal at the first source terminal. A second P-channel transistor includes a second source terminal, a second gate terminal, and a second drain terminal. The second drain terminal is coupled to the first drain terminal. The system also includes a control circuit that is coupled to the first gate terminal and the second gate terminal. The control circuit is configured to disconnect the first gate terminal from a ground reference, and in response to the presence of the first audio signal, cause a first voltage between the first gate terminal and the first source terminal to be approximately zero and prevent the first audio signal from passing through the first drain terminal.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

FIG. 1 is a block diagram of an audio accessory device 100 connected to an electronic device 101. The audio accessory device 100 includes a processing, amplifying, and switching system 102. The system 102 is electrically coupled to the electronic device 101 (for example, via a wired or wireless connection). The system 102 is configured to process and amplify audio signals received from an audio amplifier 103 of the electronic device 101. The electronic device 101 may be any kind of device that is configured to output audio signals. For example, the electronic device 101 may be a mobile telephone, a portable communications radio, a converged device, a laptop, a tablet, or other similar device. In some embodiments, the system 102 is configured to receive, process, and amplify audio signals from more than one electronic device 101.

Figure 3:
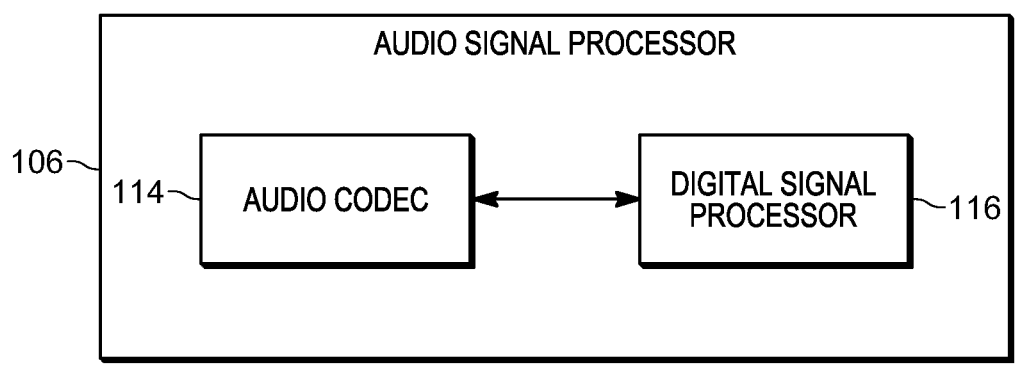
FIG. 3 is a diagram illustrating one embodiment of an audio signal processor.

In the illustrated embodiment, the audio accessory device 100 includes an audio speaker 104. The audio speaker 104 is connected to components of the system 102. In the embodiment shown, the system 102 includes an audio signal processor 106 and an audio amplifier 108 connected in a first path, P1. The system 102 also includes an audio switching circuit 110 in a second path, P2, that is parallel to the first path. P1. The audio signal processor 106 is coupled to the audio speaker 104 through the audio amplifier 108. The audio signal processor 106 is configured to process audio signals received from the electronic device 101. The audio signal processor 106, for example, may be configured to convert analog audio signals received from the electronic device 101 into digital audio signals for processing. The audio signal processor 106 may further process the digital audio signals before converting them back to an analog signal. In some embodiments, the audio signal processor 106 may attenuate the received audio signal before converting or processing or both. Accordingly, the audio signal output from the audio signal processor 106 may be amplified by the audio amplifier 108. Although illustrated as a single component, in some embodiments, the audio signal processor 106 includes multiple components. In one example, shown in FIG. 3, the audio signal processor 106 includes an audio codec 114 and a digital signal processor 116.

When the battery (not shown) of the audio accessory device 100 exceeds a power threshold (for example, greater than zero volts) sufficient enough to power the audio signal processor 106, the audio signal from the electronic device 101 flows through the audio signal processor 106 to the speaker 104. As described in more detail below, the audio switching circuit 110 is open while the battery exceeds the power threshold, preventing the audio signal from moving through path P2 of the system 102. The audio switching circuit 110 is further configured to prevent the audio signal output from the amplifier 108 from being fed back through the system 102 through path P3 (through the switching circuit 110). When the battery of the audio accessory device 100 fails to exceed the power threshold (for example, the battery is dead or no longer is able to power the audio accessory device 100), the audio signal processor 106 is no longer powered, preventing the audio signal from moving through the path P1. Meanwhile, as explained in more detail below, the audio switching circuit 110 is configured to be closed while the battery fails to exceed the power threshold so that the audio signal moves through the path P2 to the speaker 104.

In the illustrated embodiment, when travelling in path P1, a signal from the electronic device 101 is processed by the audio signal processor 106 and then provided to the audio amplifier 108. The audio amplifier 108 produces an amplified audio signal (which may be approximately the same level as the audio signal was when the signal was received at the audio signal processor 106. The audio speaker 104 outputs the amplified analog signal as audible sound. When the audio signal from the electronic device 101 is directed through the audio switching circuit 110 in path P2 instead of path P1, the audio signal moves through the circuit 110 and is output by the speaker 104.

The audio switching circuit 110 is configured to pass or isolate (attenuate or limit) audio signals from the audio amplifier 103 of the electronic device 101 based on a control signal (from either the electronic device 101, the audio accessory device 100, or the system 102).

As noted, the system 102 receives an audio signal from the electronic device 101. While a battery (not shown) of the audio accessory device 100 is above a power threshold, the audio signal is processed and amplified via the audio signal processor 106 and audio amplifier 108, respectively. The power threshold may be, for example 5% of the state of charge of the battery. The amplified audio signal is then output through the audio speaker 104. While the battery is above the power threshold, the audio switching circuit 110 blocks signals from travelling in path P2 and P3. While the battery is below the power threshold, the audio signal is received by the audio switching circuit 110 (instead of the audio signal processor 106 and the audio amplifier 108) and directed through the circuit 110 to the speaker 104.

Figure 2:
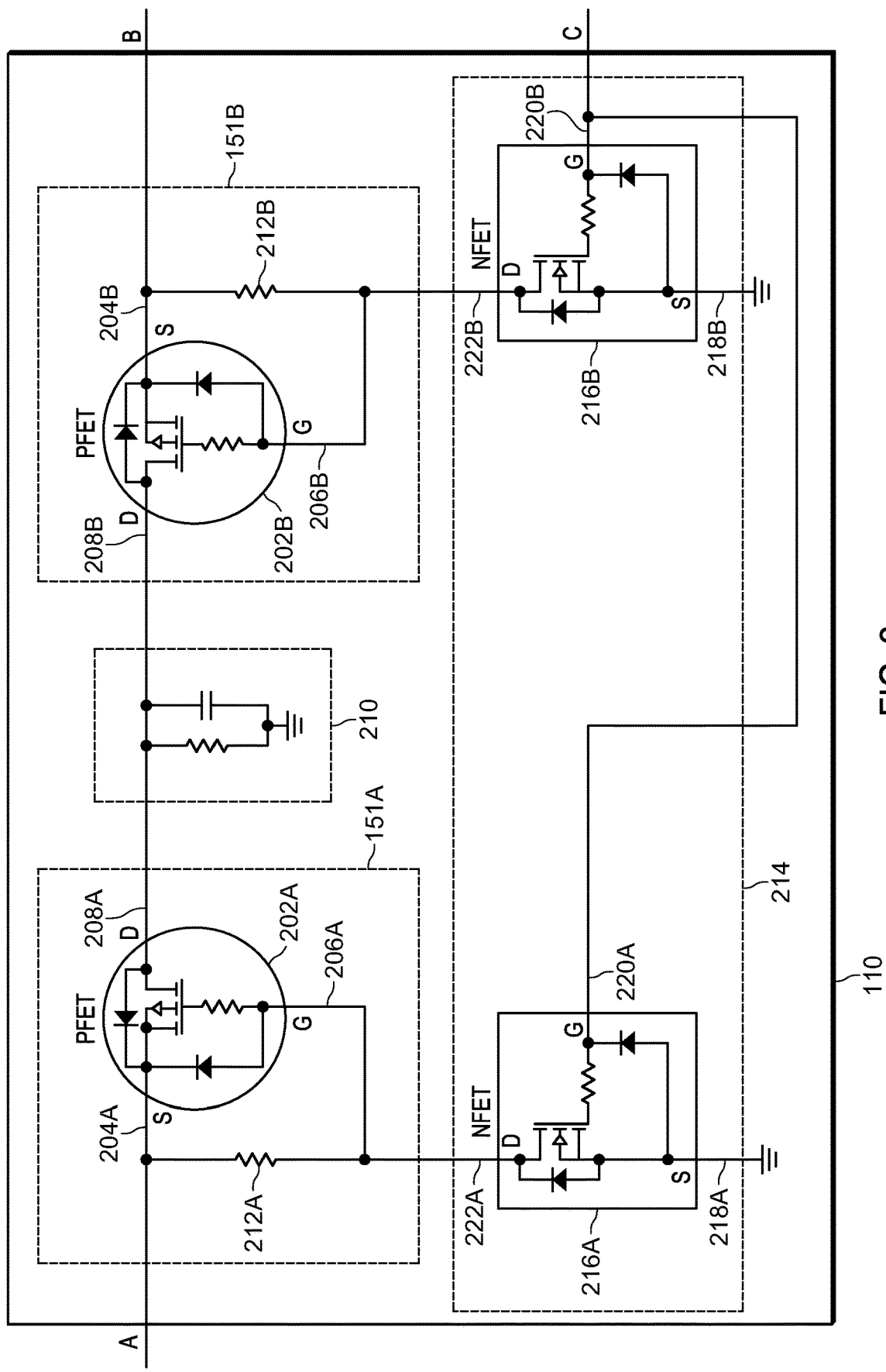
FIG. 2 is a diagram of an audio switching circuit of the audio accessory device of FIG. 1 in accordance with some embodiments.

FIG. 2 is a circuit diagram of the audio switching circuit 110 in accordance with some embodiments. The audio switching circuit 110 includes terminals A and B. Terminal A is coupled to the electronic device 101 (specifically, the audio amplifier 103) and terminal B is coupled to the speaker 104 of FIG. 1. The audio switching circuit 110 is bi-directional, meaning audio signals may move through the circuit from terminal A to B and vice versa. Thus, the circuit behavior and methods described herein in terms of a first component (for example, P-channel transistor 202A) may also be performed similarly by a second corresponding component (for example, P-channel transistor 202B). For ease of description, the first component and its corresponding second component are labeled with the same numeral but end with A and B respectively (for example, P-channel transistors 202A and 202B). In the illustrated example, the circuit 110 includes a terminal C coupled to a control circuit (not shown) of the system 102. The control circuit is configured to enable and disable the audio switching circuit 110. The control circuit may include one or more discrete components as well as one or more electronic processors. Although illustrated as being part of the system 102, in some embodiments the control circuit may alternatively or additionally be part of the audio accessory device 100, the electronic device 101, or both.

In the example shown, the audio switching circuit 110 includes a first transistor stage 151A and a second transistor stage 151B. The first transistor stage 151A is configured similar to the second transistor stage 151B. The first and second transistor stages 151A and 151B include one or more discrete components, including transistors, and are configured to act similar to switches. Each transistor stage 151A and 151B is configured to receive audio signals from either the corresponding terminal (for example, the transistor stage 151A is configured to receive audio signals from terminal A and the transistor stage 151B is configured to receive audio signals from terminal B) and from each other. Each of the stages 151A and 151B are configured to allow audio signals below a particular voltage threshold through to the opposite terminal (for example, from terminal A to B and vice versa). Both stages are configured to prevent the audio signal that has entered a first terminal of the circuit 110 from passing through the circuit 110 to the opposite terminal based on the control signal received at the terminal C. In particular, as shown in the example illustrated, the stages "open" (prevent signals from passing through) or "close" (allow signals through) based directly on the control signal. The stages 151A and 151B include one or more transistors (or similar voltage-controlled switching components) that the audio signal must travel through in order to reach the opposite terminal.

In the illustrated embodiment, the circuit 110 includes a first P-channel transistor 202A (of the first transistor stage 151A) and a second P-channel transistor 202B (of the second transistor stage 151B). The first P-channel transistor 202A includes a source terminal 204A, a gate terminal 206A, and a drain terminal 208A. The second P-channel transistor 202B also includes a source terminal 204B, a gate terminal 206B, and a drain terminal 208B. The drain terminal 208A is coupled to the drain terminal 208B. In the illustrated example, the drain terminals 208A and 208B are coupled together via a filter 210. The filter 210 is configured to filter (or attenuate) any undesired audio bleeding through either P-channel transistor 202A or 202B (depending on the direction of the audio signal) as explained below in more detail. In the illustrated example, the filter 210 is an RC filter. As also illustrated in FIG. 2, a first resistor 212A is coupled to the source terminal 204A and the gate terminal 206A of the P-channel transistor 202A. Similarly, a second resistor 212B is coupled to the source terminal 204B and the gate terminal 206B of the P-channel transistor 202B. The first and second resistor 212A and 212B are both approximately the same resistance and may be sized based on the impedance of the audio signal processor 106. In the illustrated embodiment, the first and second resistor 212A and 212B are both approximately 100K ohms.

The audio switching circuit 110 and enable-disable circuit 214 are driven by the terminal C. The enable-disable circuit 214 is configured to control the transistors 202A and 202B such that an audio signal received at either transistor 202A and 202B flows or passes through both the transistors 202A or 202B to the opposite terminal of the circuit 110. For example, as illustrated in FIG. 2, the enable-disable circuit 214 includes a first N-channel transistor 216A and a second N-channel transistor 216B. The first N-channel transistor 216A includes a source terminal 218A, a gate terminal 220A, and a drain terminal 222A. The second N-channel transistor 216B also includes a source terminal 218B, a gate terminal 220B, and a drain terminal 222B. The N-channel transistor 216A is coupled to the first gate terminal 206A of the first P-channel transistor 202A (via the drain terminal 222A) and the second N-channel transistor 216B is coupled to the second gate terminal 206B of the second P-channel transistor 202B (via the drain terminal 222B).

The N-channel transistor 216A controls the P-channel transistor 202A based on an electrical signal (from the terminal C) received at the gate terminal 220A. The N-channel transistor 216B controls the P-channel transistor 202B based on an electrical signal received (from the terminal C) at the gate terminal 220B of the N-channel transistor 216B. In the illustrated embodiment, when the terminal C is driven low (for example, approximately 0 volts), both P-channel transistors 202A and 202B are opened, preventing any audio signal received at either terminal A or B from passing through the transistors 202A and 202B via the source terminal 204A and 204B and the corresponding drain terminal 208A and 208B. When the terminal C is driven high (for example, approximately 5 volts), both P-channel transistors 202A and 202B are closed, allowing audio signals received at either terminal A or B through the transistors 202A and 202B. It should be understood that, while the term "prevent" is used, in some cases the audio signal may not be completely prevented from travelling through the transistor 202A, through the transistor 202B, of both of these transistors. In some cases, some of the audio signal may leak or "bleed through" the one or both of the transistors 202A and 202B. Portions of the audio signal that leak through the transistors 202A and 202B are attenuated via the filter 210.

When the terminal C is driven low, the N-channel transistors 216A and 216B are open. The P-channel transistors 202A and 202B, in this state, will open when an audio signal is present at their source terminal 204A and 204B because the resistors 212A and 212B coupled to the source terminal 204A and 204B and the gate terminal 206A and 206B cause the gate to source voltage ($V_{GS}$) of the transistors 202A and 202B to be approximately zero (regardless of the amplitude of the audio signal). Since the $V_{GS}$ of the transistors 202A and 202B are both approximately zero regardless of the amplitude of the audio signal, the $V_{GS}$ of the transistors 202A and 202B will always be above the (negative) gate to source threshold voltage ($V_{GS(th)}$) of the P-channel transistors 202A and 202B. As a consequence, the transistors 202A and 202B are open. Thus, the audio signal is prevented from passing through the transistors 202A and 202B.

Because the opening of the transistors 202A and 202B is independent of the amplitude of the audio signal (or any other independent voltage) received at the source terminals 208A and 208B, the only voltage limitation in the circuit 110 is the rating of the maximum drain to source voltage of the P-channel transistor 202A and 202B. In addition, since the transistor 202A and 202B is driven by the audio signal itself (when the control signal places the circuit 110 in an open state), there is no need for an additional independent control signal to drive the transistors 202A and 202B to a voltage above a maximum voltage of the audio signal prevent the audio signal from passing through the transistors 202A and 202B. Accordingly, the audio switching circuit 110 provides better isolation of higher voltage, higher frequency audio signals.

In the illustrated example, when the terminal C is driven high (for example, approximately 5 volts), the N-channel transistors 216A and 216B are closed, connecting the respective P-channel transistor 202A and 202B to ground. When grounded, both P-channel transistors 202A and 202 are closed, allowing audio signals from either terminals A or B to pass through the transistors. Specifically, while the P-channel transistors 202A and 202B are grounded via the N-channel transistors 216A and 216B, when audio signals are present at the source terminals 204A and 204B of the P-channel transistor 202A and 202B respectively, the gate to source voltages (known as $V_{GS}$) of each P-channel transistor 202A and 202B are less than the gate to source threshold voltage $V_{GS(th)}$ of the P-channel transistors 202A and 202B. This closes the P-channel transistors 202A and 202B. In some circumstances, a portion of the audio signal may still be blocked in this state. For example, depending on the DC bias of the audio signal, the presence of a lower voltage swing portion of a larger audio signal at either source terminal 204A or 204B may cause the $V_{Gs}$ of the P-channel transistor 202A or 202B to be greater than the $V_{GS(th)}$, causing the P-channel transistor 202A or 202B to open momentarily. This may be the case when the DC bias of the audio signal is a low value close to the $V_{GS(th)}$ of the particular P-channel transistor 202A or 202B. Since the P-channel transistors 202A or 202B are open, the lower voltage swing portion of the audio signal is prevented from passing through the particular P-channel transistors 202A or 202B.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus described herein. Alternatively, some or all functions could be implemented by a state machine that has no stored program instructions, or in one or more application specific integrated circuits (ASICs), in which each function or some combinations of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An audio switching circuit comprising:
a first P-channel transistor including a first source terminal, a first gate terminal, and a first drain terminal, the first P-channel transistor configured to receive a first audio signal at the first source terminal;
a first resistor coupled to the first source terminal and the first gate terminal;
a second P-channel transistor including a second source terminal, a second gate terminal, and a second drain terminal, the second drain terminal coupled to the first drain terminal;
a second resistor coupled to the second source terminal and the second gate terminal; and
a control circuit coupled to the first gate terminal and the second gate terminal, the control circuit configured to disconnect the first gate terminal from a ground reference, and
in response to the presence of the first audio signal, cause, via the first resistor, a first voltage between the first gate terminal and the first source terminal to be approximately zero, and prevent the first audio signal from passing through the first drain terminal.

2. The audio switching circuit of claim 1, wherein the second P-channel transistor is configured to receive a second audio signal at the second source terminal and wherein the control circuit is further configured to disconnect the second gate terminal from the ground reference, and in response to the presence of the second audio signal, cause, via the second resistor, a second voltage between the second gate terminal and the second source terminal to be approximately zero and prevent the second audio signal from passing through the second drain terminal.

3. The audio switching circuit of claim 1, wherein the first resistor and the second resistor are approximately 100K ohm resistors.

4. The audio switching circuit of claim 1, wherein the first P-channel transistor and the second P-channel transistor are coupled to each other via a RC filter.

5. The audio switching circuit of claim 1, wherein the control circuit includes a first N-channel transistor coupled to the first gate terminal of the first P-channel transistor and a second N-channel transistor coupled to the second gate terminal of the second P-channel transistor.

6. A processing, amplifying, and switching system for an audio accessory device configured to receive an audio signal from an electronic device and output a processed and amplified audio signal, the system comprising:
- an audio speaker;
- an audio signal processor;
- an audio amplifier connected to the audio signal processor and to the audio speaker and configured to amplify the audio signal; and
- an audio switching circuit coupled to the audio speaker and including
  - a first P-channel transistor including a first source terminal, a first gate terminal, and a first drain terminal, the first P-channel transistor configured to receive a first audio signal at the first source terminal;
  - a first resistor coupled to the first source terminal and the first gate terminal;
  - a second P-channel transistor including a second source terminal, a second gate terminal, and a second drain terminal, the second drain terminal coupled to the first drain terminal;
  - a second resistor coupled to the second source terminal and the second gate terminal; and
  - a control circuit coupled to the first gate terminal and the second gate terminal, the control circuit configured to disconnect the first gate terminal from a ground reference, and in response to the presence of the first audio signal, cause, via the first resistor, a first voltage between the first gate terminal and the first source terminal to be approximately zero and prevent the first audio signal from passing through the first drain terminal.

7. The system of claim 6, wherein the second P-channel transistor is configured to receive a second audio signal at the second source terminal and wherein the control circuit is further configured to disconnect the second gate terminal from the ground reference, and in response to the presence of a second audio signal, cause, via the second resistor, a second voltage between the second gate terminal and the second source terminal to be approximately zero and prevent the second audio signal from passing through the second drain terminal.

8. The system of claim 6, wherein the first resistor and the second resistor are approximately 100K ohm resistors.

9. The system of claim 6, wherein the first P-channel transistor and the second P-channel transistor are coupled to each other via a RC filter.

10. The system of claim 6, wherein the control circuit includes a first N-channel transistor coupled to the first gate terminal of the first P-channel transistor and a second N-channel transistor coupled to the second gate terminal of the second P-channel transistor.

11. The system of claim 6, wherein the audio signal is routed through the audio switching circuit when a battery of the audio accessory device does not exceed a power level.

* * * * *